United States Patent [19]

Morokawa et al.

[11] Patent Number: 4,843,252

[45] Date of Patent: Jun. 27, 1989

[54] SELECTING ELECTRODE DRIVE CIRCUIT FOR A MATRIX LIQUID CRYSTAL DISPLAY

[75] Inventors: Shigeru Morokawa, Higashi-yamato; Fuminori Suzuki, Tokorozawa, both of Japan

[73] Assignee: Citizen Watch Co., Ltd., Tokyo, Japan

[21] Appl. No.: 91,300

[22] Filed: Aug. 27, 1987

Related U.S. Application Data

[63] Continuation of Ser. No. 737,421, May 24, 1985, abandoned.

[30] Foreign Application Priority Data

May 24, 1984 [JP] Japan ................................ 59-105586

[51] Int. Cl.⁴ ........................ H03K 3/01; H03K 5/156

[52] U.S. Cl. .................................... 307/264; 307/268; 307/490; 350/333

[58] Field of Search ............... 307/260, 264, 268, 482, 307/490, 555, 578; 350/331 R, 332, 333

[56] References Cited

U.S. PATENT DOCUMENTS

| | | | |
|---|---|---|---|
| 4,000,412 | 12/1976 | Rosenthal et al. | 307/264 |
| 4,123,671 | 10/1978 | Aihara et al. | 307/264 |
| 4,145,872 | 3/1979 | Portmann | 307/264 |

*Primary Examiner*—John Zazworsky

*Attorney, Agent, or Firm*—Birch, Stewart, Kolasch & Birch

[57] ABSTRACT

A selecting electrode drive circuit is capable of providing drive pulses of twice as high having an amplitude twice as large as the breakdown voltage of semiconductor devices used in the circuit. The drive pulses thus provided are applied to selecting electrodes of a matrix type display device and the driving circuit includes a pulse generator for generating a train of reference pulses, a power supply connected to the pulse generator for level-shifting the reference pulses by the crest value of the power supply and a switching circuit is powered by the power supply.

25 Claims, 7 Drawing Sheets

SELECTING ELECTRODE DRIVE CIRCUIT FOR A MATRIX LIQUID CRYSTAL DISPLAY

This application is a continuation of application Ser. No. 737,421 filed on May 24, 1985, now abandoned.

BACKGROUND OF THE INVENTION

1. FIELD OF THE INVENTION

The present invention relates generally to a matrix type display device and particularly to a selecting electrode drive circuit suitable for use in a matrix liquid crystal display such as a liquid crystal television.

A matrix type liquid crystal display is well known as consisting essentially of two electroded-transparencies separated by a sealed-in liquid crystal material such as a twisted nematic type liquid crystal or a guest-host type liquid crystal. The outer surface of each transparency has a transparent conductive coating in the form of parallel rows or columns. The electroded transparencies face each other with their row and column electrodes crosswise to each other, thereby forming a rectangular array of intersections of their row and column electrodes. Thus, a matrix results. In operation, a series of pulses at regular intervals are applied to the row electrodes, that is, selecting electrodes, one after another, thus sequentially bringing these selecting electrodes to a given potential for a very short period.

On the other hand, video signals representing a piece of visual information to be displayed are applied to the column electrodes, that is, data electrodes, thereby darkening the liquid crystal at selected intersections enough to form a visible shape.

With a view to extending the life of the liquid crystal used in a matrix type liquid crystal display device, the selection of the electrodes is performed by alternately using positive-going pulses and negative-going pulses described as follows. In interfaced scanning, alternate electrodes are driven by positive-going pulses in one frame and the remaining electrodes by negative-going pulses in the next frame. Otherwise, the selection is performed by applying alternating pulses at regular intervals to the selecting electrodes one after another.

There has been an ever increasing demand for improving the resolution of a matrix type liquid crystal display device. The resolution of the display will increase with an increase in the number of selecting (row) and data (column) electrodes. The increase in the number of selecting data electrodes, however, will lead to a decrease of the duration of each driving pulse enough to assure that driving pulses do not bring adjacent selecting electrodes to their active states at the same moment. In order to assure that selected intersections of the liquid are darkened enough to form a visible image, the decrease of pulse duration will have to be compensated for by increasing the amplitude or height of pulse. As a matter of fact, the amplitude of each driving pulse needs to be multiplied by the square root of the number of rows or columns.

A selecting electrode drive circuit usually uses C-MOS devices whose breakdown voltage ranges from about 20 to 22 volts. This figure of breakdown voltage of the semiconductor device accordingly limits the resolution of a matrix type liquid crystal display.

With a view to expanding the limit of resolution beyond the one permitted by the breakdown voltage of semiconductor devices used in a matrix type display device, the object of the present invention is to provide a selecting electrode drive circuit which is capable of providing driving pulses of twice the amplitude of the breakdown voltage of semiconductor devices, thus permitting a substantial increase in the number of selecting and data electrodes in the matrix type display device, and hence a corresponding increase of resolution in the matrix type display device.

SUMMARY OF THE INVENTION

In accordance with the present invention, a selecting electrode circuit for a matrix type display device essentially consists of; a pulse generator for providing reference pulses at regular intervals; a power supply means for supplying a constant voltage at two terminals which changes in amplitude with respect to a ground similiar to the waveform of said reference pulse; and a switching circuit powered by said power supply means.

Other objects and advantages of the present invention will be understood from the following description of preferred embodiments of the present invention.

DETAILED DESCRIPTIONS OF THE PREFERRED EMBODIMENTS

Figure 1:
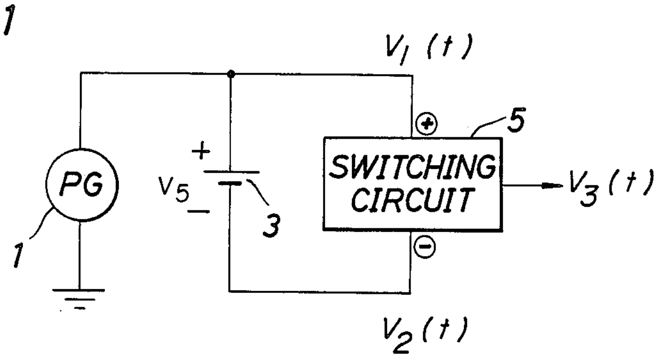
FIG. 1 shows a selecting electrode drive circuit according to this invention.

FIG. 1 shows a selecting electrode or sweeping circuit according to the present invention. As shown in the drawing, the circuit comprises a pulse generator 1, a battery or source of electric potential 3 connected to the pulse generator 1 and a switching circuit 5 connected across the battery 3. The voltage $V_B$ of the battery 3 is selected to be equal to the breakdown voltage of C-MOSs used in the switching circuit 5. The height or amplitude Vm of reference pulses provided by the pulse generator 1 is selected to be equal to the voltage of the battery 3 and hence the breakdown voltage of the semiconductor devices used in the switching circuit. With this arrangement a train of reference pulses $V_1(t)$ are supplied to one of the two input terminals (positive terminal) of the switching circuit 5 by the pulse generator 1. At the same time the train of reference pulses $V_1(t)$ are level-shifted by an amount equal to the amplitude of the reference pulse $V_m$ to produce level-shifted pulse signals $V_2(t)$. The level-shifted pulse signals $V_2(t)$ are applied to the other input terminal (negative terminal) of the switching circuit 5. The switching circuit 5 is designed to receive these different waveforms $V_1(t)$ and $V_2(t)$ (see FIG. 2) and to utilize the so sampled parts into a desired phase-shifted alternating drive signal $V_3(t)$ essentially consisting of positive going pulses and negative going pulses (see FIGS. 3A, 3B, 3C and 3D).

Figure 3A:
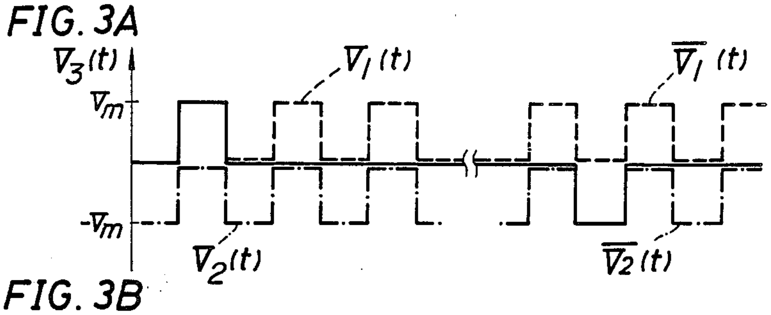
FIGS. 3(A), 3(B), 3(C) and 3(D) show waveforms of desired drive pulses.

Specifically, a design drive pulse signal $V_3(t)$ represented by the solid line as shown in the left half of FIG. 3(A) is the result of a proper selection between the signals $V_1(t)$ and $V_2(t)$; such portions being chosen in increments according to the reference pulse width. During the first pulse width, FIG. 3(A) the amplitude of signal $V_1(t)$ is chosen. During the second pulse width of FIG. 3(A), the amplitude of $V_1(t)$ is also selected. The amplitude of signal $V_2(t)$ is chosen during the fourth pulse width as seen in FIG. 3(A). A desired drive pulse signal as shown in the right half of FIG. 3(A) is a result of a reversal of the wave forms of $V_1(t)$ and $V_2(t)$ and the selection of portions of these signals in increments according to the reference pulse width from these reverse wave forms $V_1(t)$ and $V_2(t)$. During the first pulse width in the right half of FIG. 3(A), the amplitude of signal $V_2(t)$ is selected during the second pulse width in the right half of FIG. 3(A), the amplitude of signal $V_2(t)$ is chosen. $V_1(t)$ is not chosen until the fourth pulse width in the right half of FIG. 3(A).

Figure 3B:
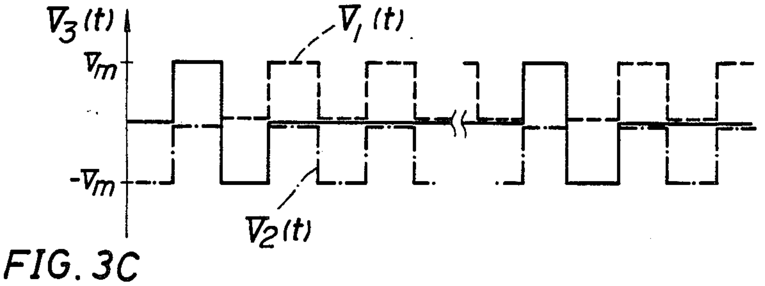

Similarly, a drive pulse signal as shown in FIG. 3(B) is created, as selected portions in specific pulse width areas are chosen from the wave forms $V_1$ and $V_2$ in the order of $V_1$, $V_1$, $V_2$, $V_2$, $V_1$, $V_2$ . . . $V_1$, $V_1$, $V_2$, $V_2$, $V_1$, $V_2$ . . . , so that the selected portion are combined one after another to create the signal $V_3(t)$ represented by the solid line in FIG. 3(B).

Figure 3C:
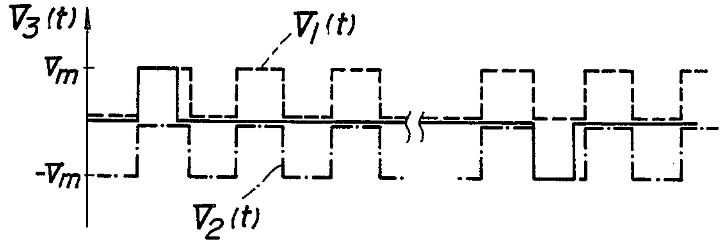
Figure 3D:
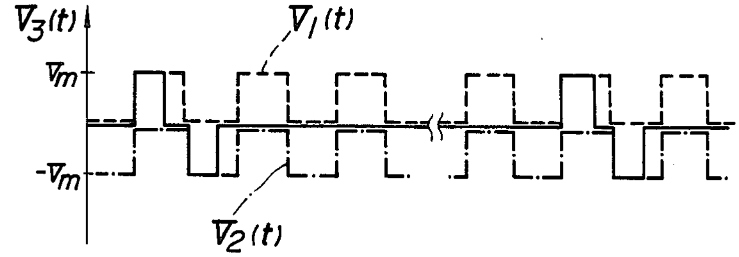

Desired drive pulse signals as shown in FIGS. 3C and 3D are built up by narrowing the width of the pulse signal shown in FIG. 3A by use of clock pulses of high frequency. Thus, width narrowed drive pulse signals are effectively used to control the brightness of the visual images as displayed.

Figure 4:
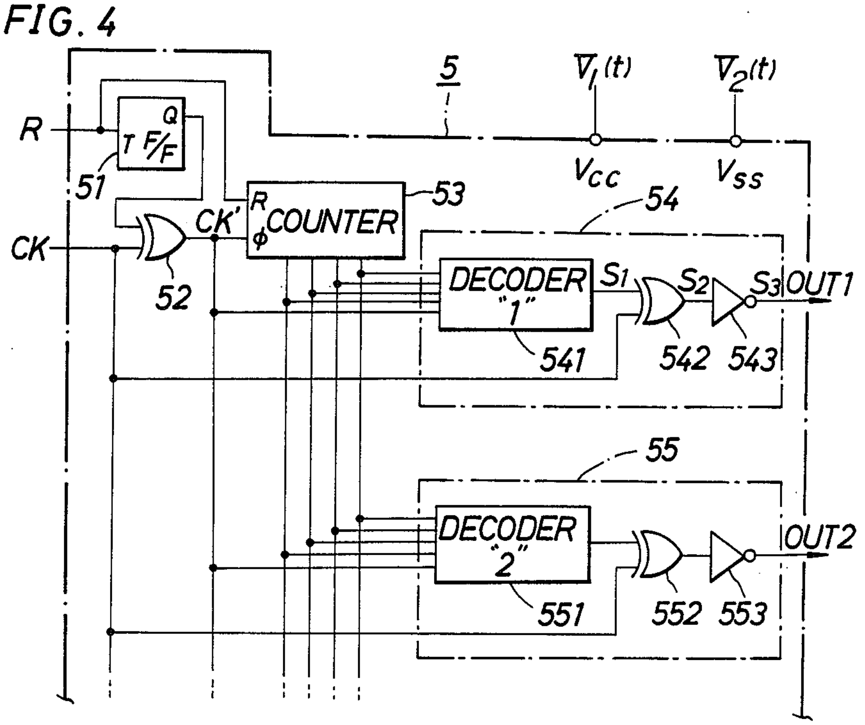
FIG. 4 shows a wiring diagram of an embodiment of a switching circuit.

FIG. 4 shows an embodiment of a switching circuit arrangement appropriate for the purpose of building a desired drive pulse as shown in FIG. 3A. The switching circuit 5 is shown as consisting essentially of a toggle type flip-flop 51, an EXCLUSIVE-OR gate 52 connected to the "Q" terminal of the flip-flop 51, a four-bit binary counter 53 connected to the EXCLUSIVE-OR gate 52 and as many selecting units 54, 55, . . . as the selecting electrode of the matrix. These selecting units are connected to the EXCLUSIVE-OR gate 52 and the four-bit binary counter 53. As shown, each selecting unit consists of a decoder 541, 551, . . . , an EXCLUSIVE-OR gate 542, 552, . . . and an inverter 543, 553 . . . The switching circuit is driven by the reference pulse signal $V_1(t)$, connected to terminal $V_{CC}$ of an integrated switching circuit 5 and the level-shifted pulse signal $V_2(t)$ as shown in the FIG. 4. The decoder 541 of the first selecting unit 54 is responsive to the five bit signal consisting of the four bit output (0001) of the counter 53 and the output signal CK'(1) from the EXCLUSIVE-OR gate 52 for providing a negative-going pulse in coincidence with the first reference pulse just counted (see "$S_1$", in FIG. 5). Likewise, the decoder 551 of the second selecting unit 55 is responsive to the five bit signal consisting of the four bit output (0001) of the counter 53 and the output signal CK'(0) from the EXCLUSIVE-OR gate 52 for providing a negative-going pulse in coincidence with the inter-pulse space subsequent to the first reference pulse. The decoder of the "n"th selecting unit (not shown) is responsive to the four bit output of the counter (53) and the output signal CK' from the output signal from the EXCLUSIVE-OR gate 52 for providing a negative-going pulse.

Figure 5:
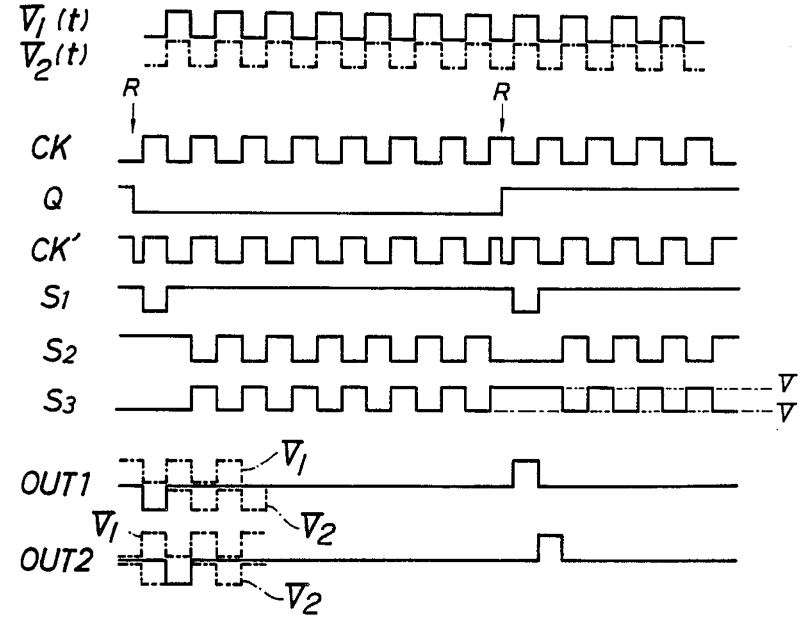
FIG. 5 shows waveforms of signals appearing at different portions of the switching circuit of FIG. 4.

Taking the first selecting unit 54 as an example, the output $S_1$ of the decoder 541 and the signal CK are given to the EXCLUSIVE-OR gate 542 to produce the output $S_2$ as shown in FIG. 5. The output $S_2$ of the EXCLUSIVE-OR gate 542 is inverted by the inverter 543 to produce the output $S_3$ as shown in FIG. 5. As mentioned above, as the switching circuit 5 is supplied as its driving power source with the reference pulse signal $V_1(t)$ and the level-shifted pulse signal $V_2(t)$, the output OUT1 as shown in FIG. 5 is taken out of the first selecting unit 54. Likewise the output OUT2 also as shown in FIG. 5 is taken out of the second selecting unit 55 half a clock period later.

Figure 6:
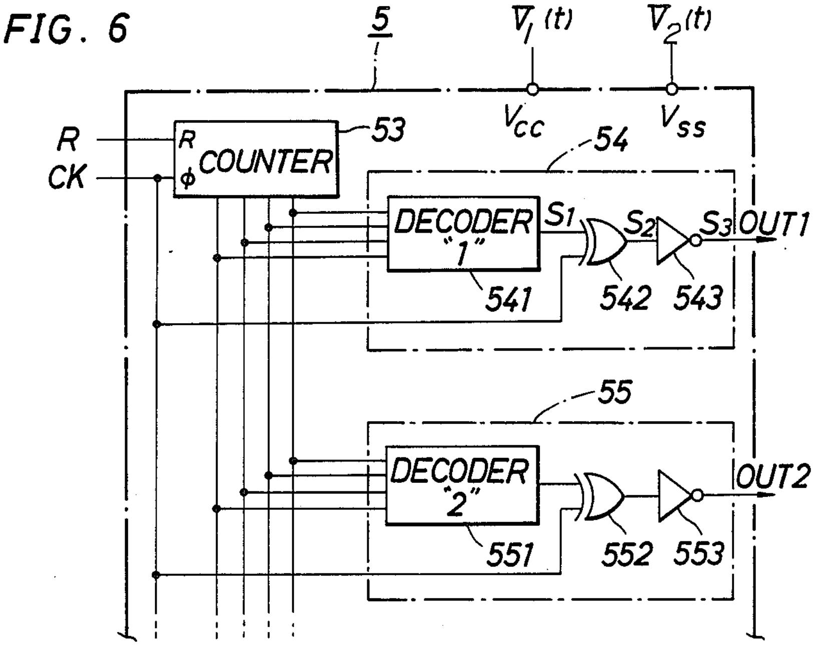
FIG. 6 shows a wiring diagram of another embodiment of a switching circuit.

FIG. 6 shows another embodiment of a switching circuit arrangement for building a desired drive pulse as shown in FIG. 3B. The arrangement of the switching circuit is similar to that of the switching circuit shown in FIG. 4 except that the reset signal R and the clock signal CK are directly applied to the counter 53. In this embodiment, like components are designated by like reference numerals and explanation thereof is omitted.

Figure 7:
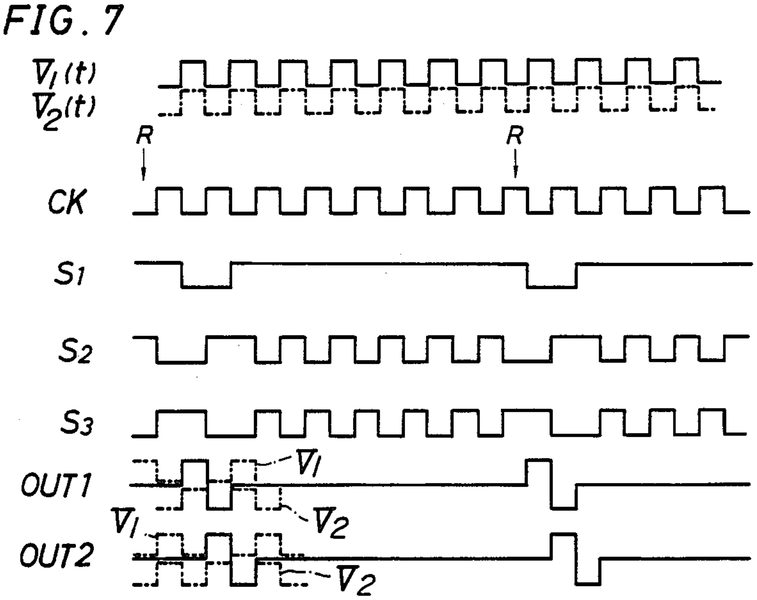
FIG. 7 shows waveforms of signals appearing at different portions of the switching circuit of FIG. 6.

FIG. 7 shows waveforms of signals appearing at different portions of the switching circuit of FIG. 6. Operation of the circuit is similar to that of the embodiment shown in FIG. 4 and thus the drive signals shown as OUT1 and OUT2 in FIG. 7 can be taken out of the switching circuit.

Figure 8:
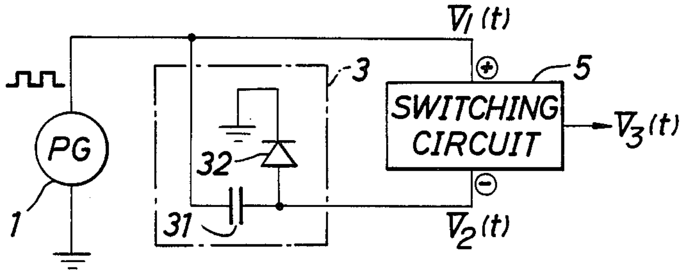
FIGS. 8, 9, 10, 11 and 12 show selecting electrode drive circuits using different sources of electric potential.

FIG. 8 shows a selecting electrode drive circuit having a clamping unit as a source of electric potential according to the present invention.

As shown in the drawing, the clamping unit 3 consists of a capacitor 31 and a diode 32. One plate (left in the drawing) of the capacitor 31 is connected to the positive terminal of the pulse generator 1 and the positive terminal of the switching circuit 5. The other plate (right in the drawing) of the capacitor 31 is connected to the anode of the diode 32 and to the negative terminal of the switching circuit 5. The cathode of the diode 32 is grounded.

Figure 2:
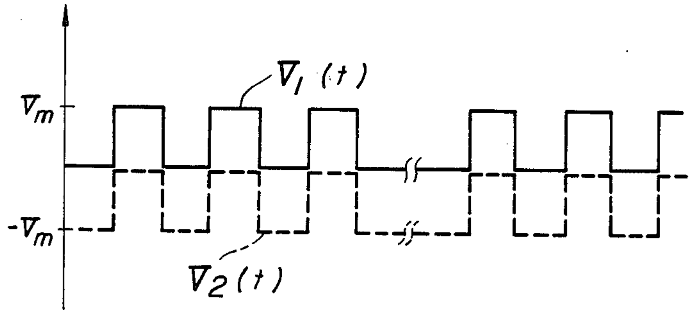
FIG. 2 shows a train of reference pulses supplied by a pulse generator and another train of pulses level-shifted by the same amount as the reference pulse amplitude.

In operation, a train of reference pulses $V_1$ as shown in FIG. 2 are applied to the clamping unit 3, particularly to the capacitor 31 of the clamping unit 3. Assume that a positive going pulse is applied to the capacitor 31, and then an electric current flows to the ground through the capacitor 31 and the diode 32, thereby charging the capacitor 31 to as high a potential Vm as the crest of the reference pulse. When the reference pulse disappears, the potential of the left-plate of the capacitor 31 descends to zero, or the potential of the ground, and consequently the right plate of the capacitor 31 descends to −Vm, thereby causing the diode 32 to be backward biased. Thus, a train of pulses which are level-shifted by the same amount as the amplitude or height of the reference pulses (broken lines in FIG. 2), result.

As earlier described, the switching circuit 5 functions to sample these reference pulses $V_1$ and level-shifted pulses $V_2$ and combine the sampled portions for providing desired train of alternating pulses $V_3$ at the output terminal of the switching circuit 5. Then, the switching circuit 5 works with the voltage Vm applied thereacross, providing pulses whose peak-to-peak amplitude is twice as large as Vm.

Figure 9:
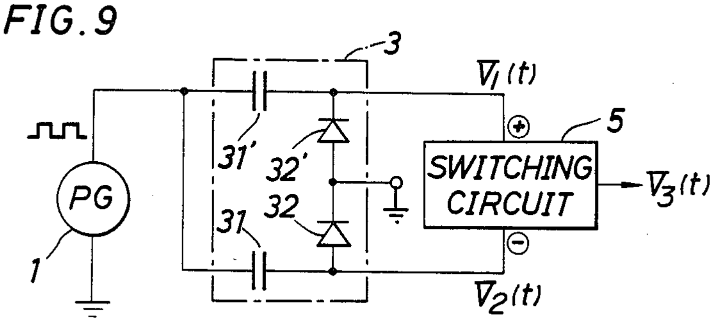

FIG. 9 shows another selecting electrode drive circuit having a similar clamping unit 3. As shown in the drawing the clamping unit 3 has an extra capacitor 31' and a diode 32'. These extra elements are connected in the symmetrical relation with the capacitor 31 and the diode 32 with respect to the input terminals of the switching circuit 5 and the ground, thereby making equal the impedance $Z_{PG}$ as viewed from the positive terminal of the switching circuit 5 and the ground towards the pulse generator 1 and the impedance $Z_{NG}$ as viewed from the negative terminal of the switching circuit 5 and the ground. This assures that the absolute value of the crest of the positive-going pulse will not be different from that of the negative-going pulse. The clamping unit 3 works in the same way as that of the sequential drive circuit of FIG. 8.

Figure 10:
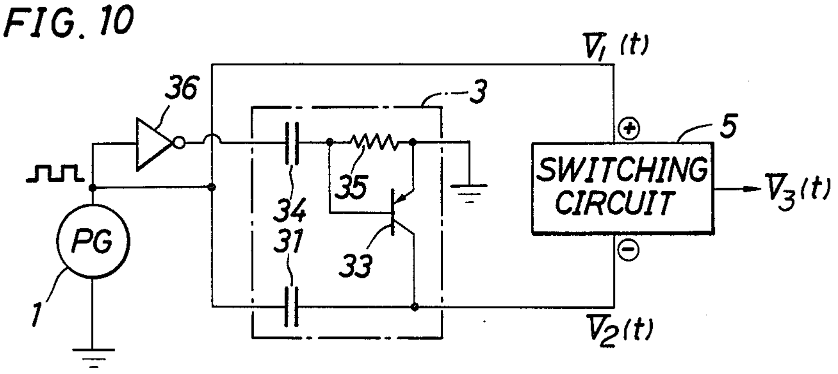

FIG. 10 shows still another selecting electrode drive circuit having a clamping unit as a source of electric potential. The clamping unit 3 uses a switching transistor in place of a clamping diode, thereby reducing the voltage drop across the clamping element (for instance, about 0.6 volts for a silicon diode if used) to a possible minimum (about 0.01 volts).

As shown in FIG. 10, the clamping unit 3 essentially consists of a switching transistor 33 whose collector and emitter electrodes are connected to the negative terminal of the switching circuit 5 and the ground, respectively. A clamping capacitor 31 connected between the collector electrode of the transistor 33 and the positive terminal of the pulse generator 1, a bias resistor 35 connected between the emitter electrode and the base electrode of the transistor 33, a dc-blocking capacitor connected to the joint between the resister 35 and the base electrode of the transistor 33, and an inverter 36 connected between the capacitor 34 and the positive terminal of the pulse generator 1.

In operation assume that a positive-going pulse is applied both to the inverter 36 and the clamping capacitor 31. Then, the positive-going pulse is inverted by the inverter 36, and the resultant negative-going pulse is applied to the base electrode of the transistor 33 after passing through the capacitor 34, thereby putting the transistor 33 in its conductive state, and causing the capacitor 31 to be charged with electricity to as high a potential as the crest of Vm the positive-going pulse. Then, the first positive-going pulse disappears at the input terminal of the inverter 36 to bring the transistor 33 in its non-conductive state. The left plate of the clamping capacitor 31 is at the ground potential, and consequently the right plate of the clamping capacitor descends to −Vm. Thus, a train of pulses level-shifted by the same amount as the amplitude or height of the reference pulse are applied to the negative terminal of the switching circuit 5 while a train of reference pulses are applied to the positive terminal of the switching circuit 5.

Figure 11:
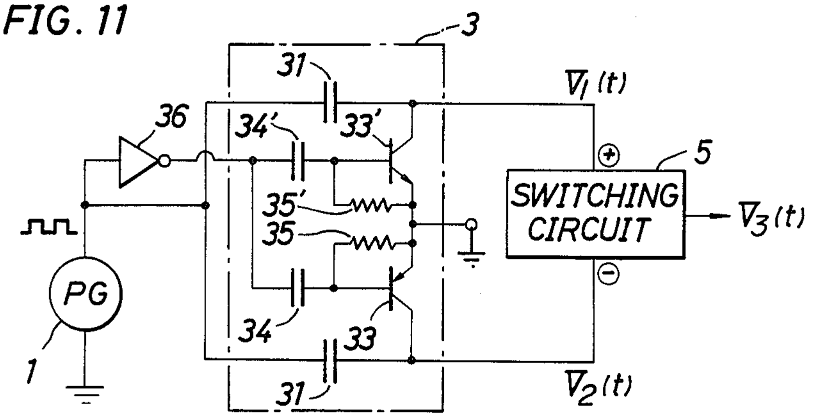

FIG. 11 shows a modification of the clamping unit of the selecting electrode drive circuit of FIG. 10. Specifically, it contains a symmetric counterpart to the switching structure of the clamping unit of FIG. 10 for the purpose of impedance balancing as viewed from the positive and negative terminals of the switching circuit 5 towards the pulse generator 1.

Figure 12:
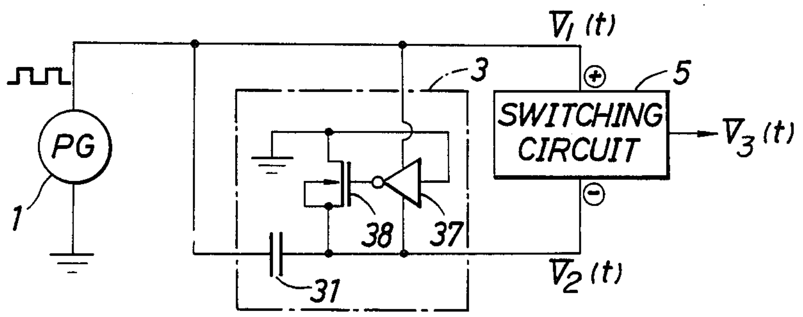

Finally, FIG. 12 shows a selecting electrode drive circuit using still another clamping unit 3 as a source of electric potential according to the present invention. As shown, the clamping unit 3 essentially consists of a clamping capacitor 31 connected between the negative terminal of the switching circuit 5 and the positive terminal of the pulse generator 1, an inverter 37 connected to the ground at its input terminal and across the switching circuit 5, and a field effect transistor 38 whose source, gate and drain electrodes are connected to the negative terminal of the switching circuit 5, the output terminal of the inverter 37 and the ground, respectively.

In operation, if a positive-going pulse of the reference pulses generated by the pulse generator 1 is applied to the inverter 37, then the transistor 38 becomes conductive, so that the clamping capacitor 31 is charged to as high a potential as the crest of the applied positive-going pulse. When the first positive-going pulse of the reference pulses disappears, the transistor 38 is brought into non-conductive state by the inverter 37 and then the left plate of the clamping capacitor 31 will be at the ground potential and consequently the potential of the right plate of the clamping capacitor 31 descends to −Vm. Thus, a train of pulses as level-shifted by the same amount as the amplitude or height of the reference pulse are applied to the negative terminal of the switching circuit 5 while a train of reference pulses are applied to the positive terminal of the switching circuit.

It is to be understood that, although the invention has been described in connection with particular embodiments, the invention should not be limited thereto and can be subjected to various changes and modifications without departing from the spirit of the invention.

What is claimed is:

1. An electrode drive circuit for driving an electrode of a matrix liquid crystal display comprising:
switching circuit means for developing a switching waveform having first, second and third voltage levels at an output thereof, said switching means having a first and second supply input terminal;
power supply means for supplying power to said switching circuit means, said power supply means supplying a constant supply voltage across [to] said first and second supply input terminals of said switching circuit means;
a circuit ground; and
pulse voltage generator means, connected between said circuit ground and said first supply input terminals, for supplying a periodic voltage pulse waveform having a pulse voltage amplitude of Vm and for varying the voltage supplied to said switching circuit means with respect to said ground, thereby [vary] varying the voltage developed by said switching circuit means with respect to said ground.

2. The drive circuit of claim 1 wherein said constant supply voltage comprises a voltage Vb supplied across said first and second supply input terminals of said switching circuit means, said voltage Vb being substantially equal to said pulse voltage amplitude Vm of said pulse voltage generator means.

3. A selecting electrode drive circuit for a matrix liquid crystal display comprising:
power supply means for supplying a constant power supply voltage across first and second power supply output terminals of said power supply means;
a circuit ground;
switching circuit means, having first and second power input terminals operatively connected to said first and second power supply output terminals, for developing an output voltage signal at least one output terminal of said switching means; and
pulse generating means, operatively connected to one of said output supply terminals, for supplying reference voltage pulses to said first and second power supply output terminals and for varying the voltage level at each power supply output terminal with respect to ground, said reference voltage pulses having a voltage amplitude of Vm;

said pulse generating means, in cooperation with said power supply means, providing first, second and third voltage levels with respect to ground to said first and second power input terminals of said switching circuit means;

said switching circuit means including selecting means, operatively connected to said first and second power input terminals, for selecting one of said first or second power input terminals, said selection means timing the selection of one of said first or second input terminals so that a desired one of said first, second, or third voltage levels present at said selected power input terminal is provided to at least one of said output [terminal] terminals, [to develop] thereby enabling said output voltage signal to have at one of said three voltage levels as its amplitude.

4. The selecting electrode drive circuit as claimed in claim 3, wherein said selection means comprises:

inverter means, having a positive power terminal, a negative power terminal, an output terminal and an input terminal, for providing said output voltage signal at said output terminal, said positive power terminal connected to said first power input terminal, said negative power terminal connected to said second power input terminal; and counter means, operatively connected to said in terminal of said inverter means, for providing a digital control signal, said output voltage signal being the voltage level present at said first power input terminal with respect to said circuit ground when said digital control signal is low and said output voltage signal being the voltage level present at said second power input terminal with respect to said circuit ground when said digital signal is high.

5. The selecting electrode drive circuit as claimed in claim 4, wherein said power supply means is a clamping circuit comprising:

a capacitor connected in parallel to said first and second power input terminals, a first end of said capacitor being connected to said first power input terminal and a second end being connected to said second power input terminal; and a diode having a cathode and an anode, said cathode being connected to said circuit ground and said anode being connected to said second power input terminal.

6. The selecting electrode drive circuit as claimed in claim 4, wherein said power supply means is a clamping circuit comprising:

a first capacitor, connected in series between said first power input terminal and said pulse generating means;

a second capacitor, connected in series between said second power input terminal and said pulse generating means;

a first diode having a first cathode and a first anode, said first cathode being connected to said circuit ground and said first anode being connected to said second power input terminal;

a second diode having a second cathode and a second anode, said second anode being connected to said circuit ground and said second cathode being connected to said first power input terminal.

7. The selecting electrode drive circuit as claimed in claim 4, wherein said power supply means is a clamping circuit comprising:

a first capacitor connected in parallel to said first and second input terminals;

a transistor having a collector, base, and emitter, said collector connected to said second power input terminal of said switching circuit means and said emitter connected to said circuit ground;

a second capacitor connected to said base of said transistor; and an inverter connected between said second capacitor and said pulse generating means.

8. The selecting electrode drive circuit as claimed in claim 4, wherein said power supply means is a clamping circuit comprising:

a capacitor connected in parallel to said first and second input terminals of said switching circuit means;

an inverter, having an input and output terminal, its input terminal connected to said circuit ground; and a field effect transistor having a source, gate, and drain, said source connected to said second power input terminal of said switching circuit means, said gate connected to the output terminal of said inverter, and said drain connected to said circuit ground.

9. A selecting electrode drive circuit for a matrix liquid crystal display comprising:

a circuit ground;

power supply means having first and second power supply terminals, operatively connected to said circuit ground, for supplying a constant power supply voltage across said first and second power supply terminals, said power supply means supplying to said first and second power supply terminals a first difference voltage being measured with respect to said first power supply terminal and said circuit ground and a second difference being measured with respect to said second power supply terminal and said circuit ground and supplying across said first and second power supply terminals a third difference voltage being measured with respect to said first and second power supply terminals;

said power supply means varying said first difference voltage between two possible levels and varying said second difference voltage between two possible levels, said first and second difference voltages having a common difference voltage to collectively define three possible with respect to said circuit ground voltage levels, thereby supplying two of said three possible voltage levels to said first and second power supply terminals, respectively, while maintaining said third difference voltage constant across said first and second power supply terminals; and switching circuit means, having first and second input power terminals operatively connected to said first and second power supply terminals, for supplying only one desired voltage level, from said two voltage levels being supplied to said first and second input power terminals, to an output terminal to develop an output voltage signal, said output voltage signal having a voltage level equal to one of said three possible voltage levels being supplied to said power supply terminals.

10. The selecting electrode drive circuit as claimed in claim 9, wherein said switching circuit means comprises;

selection means, operatively connected to said first and second power input terminals, for selecting one of said first or second power input terminals;

said selection means including, inverter means, having a positive power terminal, a negative power terminal, an output terminal and an input terminal, for providing said output voltage signal at said output terminal, said positive power terminal connected to said first power input terminal, said negative power terminal connected to said second power input terminal, and counter means, operatively connected to said input terminal of said inverter means, for providing a digital control signal said output voltage signal being the voltage level present at said first power input terminal with respect to said circuit ground when said digital control signal is low and said output voltage signal being the voltage level present at said second power input terminal with respect to said circuit ground when said digital signal is high.

11. The selecting electrode drive circuit as claimed in claim 9, wherein said power supply means comprises:

pulse generating means, operatively connected to one of said power supply terminals, for supplying reference voltage pulses to said first and second power supply terminals to vary the voltage level at each power supply terminal with respect to ground, said reference voltage pulses having a voltage amplitude of Vm.

12. The selecting electrode drive circuit as claimed in claim 11, wherein said power supply means further comprises:

a clamping circuit;

said clamping circuit including, a capacitor connected in parallel to said first and second power input terminals, a first end of said capacitor being connected to said first power input terminal and a second end being connected to said second power input terminal, and a diode having a cathode an anode, said cathode being connected to said circuit ground and said anode being connected to said second power input terminal.

13. The selecting electrode drive circuit as claimed in claim 11, wherein said power supply means further comprises:

a clamping circuit;

said clamping circuit including, a first capacitor, connected in series between said first power input terminal and said pulse generating means, a second capacitor, connected in series between said second power input terminal and said pulse generating means, a first diode having a first cathode and a first anode, said first cathode being connected to said circuit ground and said first anode being connected to said second power input terminal, and a second diode having a second cathode and a second anode; said second anode being connected to said circuit ground and said second cathode being connected to said first power input terminal.

14. The selecting electrode drive circuit as claimed in claim 11, wherein said power supply means further comprises:

a clamping circuit;

said clamping circuit including, a first capacitor connected in parallel to said first and second input terminals, a transistor having a collector, base, and emitter, said collector connected to said second power input terminal of said switching circuit means and said emitter connected to said circuit ground, a second capacitor connected to said base of said transistor, and an inverter connected between said second capacitor and said pulse generating means.

15. The selecting electrode drive circuit as claimed in claim 11, wherein said power supply means further comprises:

a clamping circuit;

said clamping circuit including, a capacitor connected in parallel to said first and second input terminals of said switching circuit means, an inverter, having an input and out terminal, its input terminal connected to said circuit ground, and a field effect transistor having a source, gate, and drain, said source connected to said second power input terminal of said switching circuit means, said gate connected to the output terminal of said inverter, and said drain connected to said circuit ground.

16. A method of developing a drive voltage for driving an electrode of a matrix liquid crystal display comprising the steps of:

supplying a first voltage to a first power input terminal of a switching circuit;

supplying a second voltage to a second power input terminal of the switching circuit;

maintaining a constant voltage difference across the first and second power input terminals;

varying said first and second voltages with respect to ground to make available three possible voltage levels at the first and second power input terminals;

providing only two of said three possible voltage levels at the first and second power input terminals of the switching circuit;

selecting a single desired voltage at each instant in time from the voltages provided at the first and second power input terminals of the switching circuit, said desired voltage having a voltage level equal to one of said three possible voltage levels; and outputting from the switching circuit a signal having said desired voltage selected at each instant in time to the electrode of the matrix liquid crystal display to aid the driving thereof.

17. The method as claimed in claim 16 wherein said three possible voltage levels have values Vm Volts, O volts, and −Vm volts.

18. A selecting electrode drive circuit for a matrix liquid crystal display comprising:

power supply means for producing first, second and third voltages and for supplying only two of said first, second, and third voltages to first and second power supply terminals thereof at any instant of time and for maintaining a constant voltage difference across said first and second power supply terminàls; and switching circuit means, having first and second power input terminals operatively connected to said first and second power supply terminals, for selecting one of said first or second power input terminals and for supplying the voltage present at said selected power input terminal to an output terminal to provide an output voltage signal having the voltage present at said selected power input terminal.

19. The switching electrode drive circuit as claimed in claim 18 further comprising:

a circuit ground for grounding said power supply means;

the voltage presented to said first and second power input terminals floating with respect to said circuit ground.

20. The selecting electrode drive circuit as claimed in claim 19 wherein said switching circuit means comprises:

selection means, operatively connected to said first and second power input terminals, for selecting one of said first or second power input terminals;

said selection means including, inverter means, having a positive power terminal, a negative power terminal, an output terminal and an input terminal, for providing said output voltage signal at said output terminal, said positive power terminal being connected to said first power input terminal, said negative power terminal being connected to said second power input terminal, and counter means, operatively connected to said input terminal of said inverter means, for providing a digital control signal, said output voltage signal being the voltage presents at said first power input terminal with respect to said circuit ground when said digital control signal is low and said output voltage signal being the voltage present at said second power input terminal with respect to said circuit ground when said digital signal is high.

21. The selecting electrode drive circuit as claimed in claim 19, wherein said power supply means comprises:

pulse generating means, operatively connected to one of said power supply terminals, for supplying reference voltage pulses to said first and second power supply terminals to vary the voltage level at each power supply terminal with respect to ground, said reference voltage pulses having a voltage amplitude of Vm.

22. The selecting electrode drive circuit as claimed in claim 21, wherein said power supply means further comprises:

a clamping circuit;

said clamping circuit including, a capacitor connected in parallel to said first and second power input terminals, a first end of said capacitor being connected to said first power input terminal and a second end being connected to said second power input terminal, and a diode having a cathode and an anode, said cathode being connected to said circuit ground and said anode being connected to said second power input terminal.

23. The selecting electrode drive circuit as claimed in claim 21, wherein said power supply means further comprises:

a clamping circuit;

said clamping circuit including, a first capacitor, connected in series between said first power input terminal and said pulse generating means, a second capacitor, connected in series between said second power input terminal and said pulse generating means, a first diode having a first cathode and first anode, said first cathode being connected to said circuit ground and said first anode being connected to said second power input terminal, and a second diode having a second cathode and second anode, said second anode being connected to said circuit ground and said second cathode being connected to said first power input terminal.

24. The selecting electrode drive circuit as claimed in claim 21, wherein said power supply means further comprises:

a clamping circuit;

said clamping circuit including, a first capacitor connected in parallel to said first and second input terminals, a transistor having a collector, base, and emitter, said collector connected to said second power input terminal of said switching circuit means and said emitter connected to said circuit ground, a second capacitor connected to said base of said transistor, and an inverter connected between said second capacitor and said pulse generating means.

25. The selecting electrode drive circuit as claimed in claim 21, wherein said power supply means further comprises:

a clamping circuit;

said clamping circuit including, a capacitor connected in parallel to said first and second input terminals of said switching circuit means, an inverter, having an input and output terminal, its input terminal connected to said circuit ground, and a field effect transistor having a source, gate, and drain, said source connected to said second power input terminal of said switching circuit means, said gate connected to the output terminal of said inverter, and said drain connected to said circuit ground.

* * * * *